United States Patent [19]

Nakata et al.

[11] Patent Number: 4,933,705
[45] Date of Patent: Jun. 12, 1990

[54] APPARATUS AND METHOD FOR LOADING A PHOTOSENSITIVE RECORDING SHEET TO AN IMAGE RECORDING APPARATUS

[75] Inventors: Takashi Nakata, Nagoya; Takashi Tomizawa, Aichi; Michitoshi Akao, Nagoya, all of Japan

[73] Assignee: Brother Kogyo Kabushiki Kaisha, Japan

[21] Appl. No.: 198,084

[22] Filed: May 24, 1988

[30] Foreign Application Priority Data

May 29, 1987 [JP] Japan ................................. 62-135372
Jul. 4, 1987 [JP] Japan ................................. 62-167308

[51] Int. Cl.⁵ .......................... G03B 27/32; G03C 1/72
[52] U.S. Cl. ........................................ 355/27; 430/138
[58] Field of Search ............... 355/3, 27, 28; 430/138; 242/58.3; 24/7

[56] References Cited

U.S. PATENT DOCUMENTS

| | | | |
|---|---|---|---|
| 2,009,831 | 7/1935 | Yerzley | 24/7 |
| 2,998,205 | 8/1961 | Francik | 242/58.3 |
| 3,915,399 | 10/1975 | Kron et al. | 242/58.3 |
| 4,004,315 | 1/1977 | Rials et al. | 24/7 X |
| 4,298,272 | 11/1981 | Stievenart et al. | 355/28 |
| 4,420,519 | 12/1983 | Slemmons | 24/7 X |
| 4,448,516 | 6/1984 | Arney et al. | 355/27 |
| 4,624,560 | 11/1986 | Beery | 355/27 |

Primary Examiner—Donald A. Griffin
Attorney, Agent, or Firm—Oliff & Berridge

[57] ABSTRACT

An apparatus and a method for loading a photosensitive recording sheet such as a photosensitive and pressure-sensitive recording sheet or the like to an image recording apparatus such as a photocopier or the like. The apparatus comprises a supplying roll accommodating a new photosensitive recording sheet, a take-up roll for winding the photosensitive recording sheet from the supplying roll, and a recording sheet loading means comprising a sheet like guide member having one end secured to the take-up roll and another end detachably connected to the leading end portion of the new photosensitive recording sheet, or an attaching member for connecting the leading end portion of the new photosensitive recording sheet to the tail end portion of a consumed photosensitive recording sheet which is wound around the take-up roll, thereby to automatically insert the photosensitive recording sheet into the image recording apparatus in correspondence with the winding operation of the take-up roll.

11 Claims, 3 Drawing Sheets

APPARATUS AND METHOD FOR LOADING A PHOTOSENSITIVE RECORDING SHEET TO AN IMAGE RECORDING APPARATUS

BACKGROUND OF THE INVENTION

This invention relates to an apparatus and a method for loading a photosensitive recording sheet to an image forming apparatus in which the photosensitive recording sheet drawn out of a supplying roll is subjected to exposure development and fixing operations, and then sucessively wound around a take-up roll.

A photosensitive and pressure-sensitive recording sheet has been known as a recording medium, and is described in detail in Japenese Patent Application Kokai No. 58-17432. The photosensitive and pressure-sensitive recording sheet is coated with photo-curing microcapsules containing chromogenic materials or dye precursors therein, so that an image on an image-carrying sheet is recorded upon photo-curing of the microcapsules when exposed to light. The photosensitive and pressure-sensitive recording sheet on which such latent image is recorded is brought into contact with a developer sheet under a pressure supplied by a pair of pressure-developing rollers. As this time, those microcapsules which are not subjected to photo-curing are ruptured by the pressure and the dye precursors from the ruptured microcapsules are reacted with developer material in the developer sheet, whereby the latent image on the photosensitive and pressure-sensitive recording sheet is copied to the developer sheet, so that a visible image is provided thereon. Such type of operation is generally referred to as a transfer type recording, and is disclosed in U.S. Pat. No. 4,399,209.

The photosensitive and pressure-sensitive recording sheet is succesively drawn out of the supplying roll and is wound over the take-up roll while subjected to the exposure and pressure-developing operations. Therefore, when the supplying roll is consumed, it is necessary to exchange the consumed photosensitive and pressure-sensitive recording sheet for a new one.

When the consumed photosensitive and pressure-sensitive recording sheet is exchanged for a new one, the conventional apparatus as described above has the following disadvantages; it is more difficult to pass the new photosensitive and pressure-sensitive recording sheet through a sheet carrying portion (between a pair of sheet carrying rollers), a developing portion (between a pair of pressure-developing rollers) and a fixing portion (between a pair of heat-fixing rollers) because gaps between the respective pairs of rollers are considerably narrow; and it is accompanied by a risk to manually insert the photosensitive and pressure-sensitive recording sheet into the sheet carrying portion, the development portion and the fixing portion which are located proximately to units supplied with high voltage and portions at high temperature.

SUMMARY OF THE INVENTION

An object of this invention is to provide an apparatus and a method for easily loading an image recording medium to an image forming apparatus.

Another object of this invention is to provide such apparatus and method capable of eliminating risks which may be caused by approaching an operator's hand to units supplied with high voltage and portions at high temperature in the image forming apparatus for the purpose of setting the image recording medium at a sutable location of the image forming apparatus.

Still another object of this invention is to provide such apparatus which can minimize running cost of the image forming apparatus.

These and other objects are achieved by a recording sheet loading means comprising a connecting member which is provided between a leading end portion of a new recording medium and a take-up roll, for automatically passing the recording medium successively through exposure, development and fixing portions in the image forming apparatus.

According to one aspect of this invention, the connecting member comprises a lead or guide member whose leading end is secured to the take-up roll so as to be windable around the take-up roll and which extends from the take-up roll through the development portion and the exposure portion to the supplying roll, and an attaching member for detachably connecting a tail end portion of the lead member with a leading end portion of the recording medium.

According to another aspect of this invention, the connecting member comprises an attaching member which is provided at the leading end portion of a new photosensitive recording sheet for connecting the leading end portion of the recording medium with the tail end portion of a consumed recording medium and for passing the new recording medium through the exposure and development portions to the take-up roll.

According to a further aspect of this invention, the method for loading the recording sheet to the image forming apparatus comprises the steps of forming an adhesive portion at the leading end portion of a new recording medium, connecting the adhesive portion with the tail end portion of a consumed recording medium and passing the new recording medium through the exposure and the development portions to the take-up portion. The recording medium may be a photosensitive/pressure sensitive recording sheet having continuous web form.

BRIEF DESCRIPTION OF THE DRAWINGS

The manner by which the above and other objects are attained will be fully apparent from the following detailed description when considered with the accompanying drawings, wherein.

DETAILED DESCRIPTION OF THE INVENTION

The preferred embodiments according to this invention, typically applied to a photocopier, will be described hereinunder with reference to the accompanying drawings.

Figure 1:
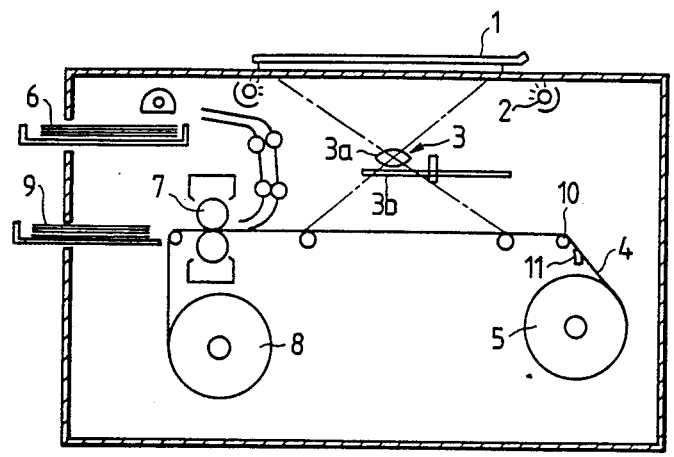
FIG. 1 is a cross sectional view showing an image forming apparatus to which a recording sheet loading member according to this invention is applied.

FIG. 1 is a cross-sectional view of a photocopier to which a recording sheet loading member according to this invention is applied. As shown in FIG. 1, light from a light source 2 is irradiated to an original on a original support stand 1 and is reflected therefrom. The reflected light passes through an optical system 3 including a lens 3a and a filter 3b and so on, and reaches an image recording medium such as a photosensitive and pressure-sensitive recording sheet 4 drawn from a supplying roll 5, to thereby form a latent image on the photosensitive and pressure-sensitive recording sheet. The photosensitive and pressure-sensitive recording sheet 4 having the latent image formed thereon and a developer sheet 6 are contacted with each other at an upstream side of a pair of fixing rollers 7, and are pressed thereby. As a result, an image corresponding to the latent image is copied to the developer sheet 6. The photosensitive and pressure-sensitive recording sheet, after the copying operation, is taken up by a take-up roll 8. In this invention, the light sources 2 and the optical system 3 constitutes the exposure portion and the pair of fixing rollers 7 constitutes the image fixing portion.

Figure 2:
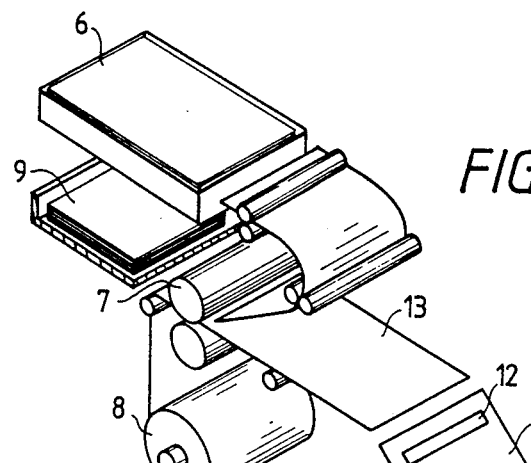
FIG. 2 is a perspective view showing the image forming apparatus as shown in FIG. 1 for explaining a first embodiment of the recording sheet loading member according to this invention.

FIG. 2 is a perspective view of the image forming apparatus as shown in FIG. 1. A leading end portion 4a of the rolled photosensitive and pressure-sensitive recording sheet (hereinunder referred to as a roll sheet) is provided with an adhesive portion 12 which comprises, for example, double-faced adhesive tape. In this embodiment, the double-faced adhesive tape may be beforehand attached to the leading end portion of the roll sheet, or may be afterward attached thereto manually or mechanically.

When the roll sheet 5 in the photocopier is consumed and the tail end portion appears from the supplying roll 5, the consumed roll sheet 13 is exchanged for a new one. A new roll sheet is provided with a double-faced-adhesive tape at the leading end portion 4a thereof, and is connected to the tail end portion 13 of the consumed roll sheet through the double-faced adhesive tape. Since the consumed roll sheet has already been arranged in the exposure, development and fixing portions in the photocopier, the leading end portion 4a of the new roll sheet can be easily and automatically arranged successively in the exposure, development and fixing portions by rotating the take-up roll 8 while the end portion 13 of the consumed roll sheet is connected to the leading end portion 4a of the new one. When the connected portion between the leading end portion 4a and the tail end portion 13 is brought into a position at the side of the take-up roll 8, the leading end portion 4a of the new roll sheet is exfoliated from the end portion 13 of the consumed roll sheet to remove the consumed roll sheet from the photocopier. At the next time, the leading end portion 4a of the new roll sheet is connected to the take-up roll 8 through the double-faced adhesive tape attached to the new roll sheet, thereby to perform the exchange of the consumed roll sheet for new one.

Figure 3:
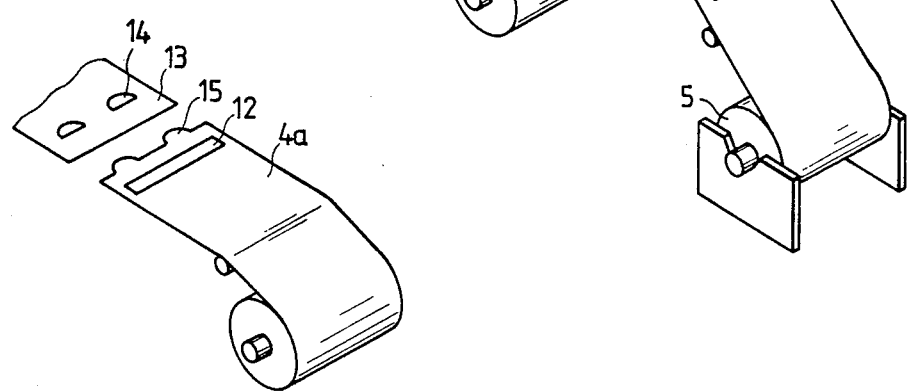
FIG. 3 is a perspective view showing a recording sheet loading means according to a second embodiment of this invention.

FIG. 3 shows a second embodiment of the recording sheet loading member according to this invention. As shown in FIG. 3, the tail end portion 13 of a consumed roll sheet and the leading end portion 4a of a new roll sheet may be respectively provided with openings 14 and projections 15 to be engaged with each other, whereby a connecting position thereof can be easily determined. That is, any one can connect the leading end portion of the new roll sheet to the tail end portion of the consumed roll sheet at the same position so long as the projections 15 at the leading end portion of the new roll sheet is engaged with the openings 14 at the tail end portion of the consumed roll sheet.

The recording sheet loading member according to this invention is not limited to the above embodiments. For example, paste may be used instead of a double-faced adhesive tape. Further, a photosensitive medium other than the photosensitive and pressure-sensitive recording sheet described above is also available.

Furthermore, even if a double-faced adhesive tape or paste is provided at the tail end portion of a consumed roll sheet instead of the leading end portion of a new roll sheet, the recording sheet loading member is considered to be formed at the leading end portion of the roll sheet when the tow sheets are joined or spliced together.

In order to exchange a consumed recording sheet for a new one in the embodiments of the recording sheet loading member as described above, the recording sheet loading member is connected between the leading end portion of a new recording sheet at the side of the supplying roll and the tail end portion of a consumed recording sheet at the side of the take-up roll and, thus joined sheets are travelled from the side of the supplying roll to the side of the take-up up roll by winding the consumed recording sheet to thereby automatically load the new recording sheet to the image forming apparatus such as a photocopier. However, the take-up roll around which the consumed recording sheet has been wound must be removed from the image forming apparatus to complete the exchange of the recording sheets. That is, both the supplying roll and the take-up roll must be exchanged for new ones each time the consumed recording sheet is exchanged for a new one. Therefore, a running cost should further be minimized in the foregoing embodiments.

Third and fourth embodiments of the recording sheet loading member as shown in FIGS. 4-8 can reduce the running cost, as well as overcome the above described prior art disadvantages.

Figure 4:
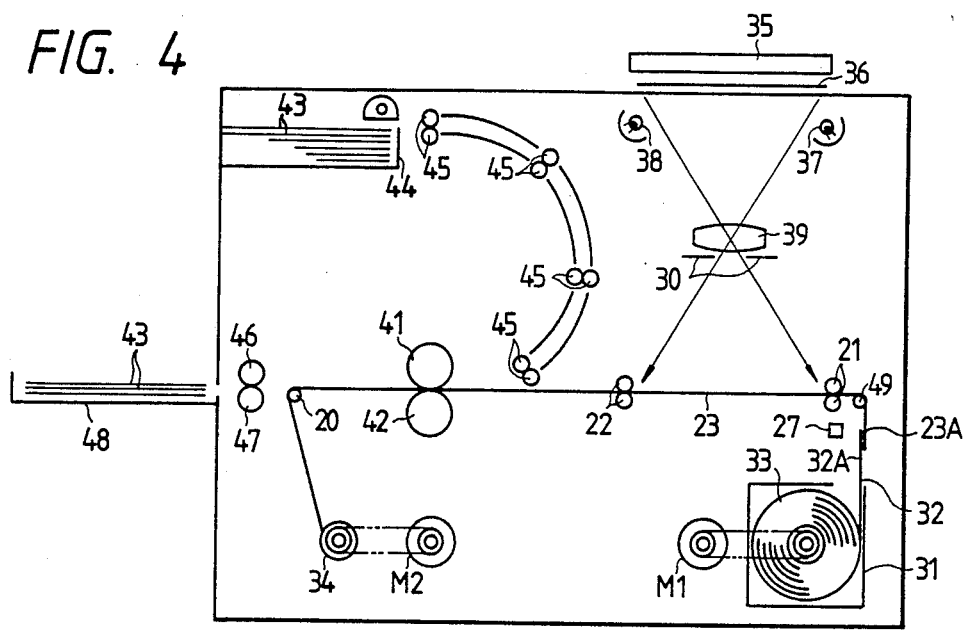
FIG. 4 is a cross-sectional view showing an image forming apparatus having a recording sheet loading means according to a third embodiment, and one end of which is connected with a recording sheet at the side of a supplying roll.

FIG. 4 is a cross sectional view showing an image forming apparatus provided with a recording sheet loading means according to a third embodiment of this invention, and shows a state where one end of the recording sheet loading means is connected with a leading end portion of a recording sheet at the side of a supplying roll 33. In this embodiment, a sheet like guide or lead member 23 is used as a recording sheet loading member.

As shown in FIG. 4, the supplying roll 33 of a photosensitive and pressure-sensitive recording sheet 32 (hereinunder referred to as a "roll sheet") is accommodated in a light-shield case 31 and is operatively coupled with a rewinding motor M1, while a take-up roll 34 is operatively coupled with a winding motor M2. The sheet like lead member 23 has substantially the same width as the roll sheet 32 and is secured to the take-up roll 34 such that it is windable around the take-up roll 4. The lead member 23 has a sufficient length to allow extension from the take-up roll 34 through a roll sheet path to the supplying roll 33, the path being defined by guide rollers 49, 20 and a pair of feed rollers 41, 42.

Figure 5:
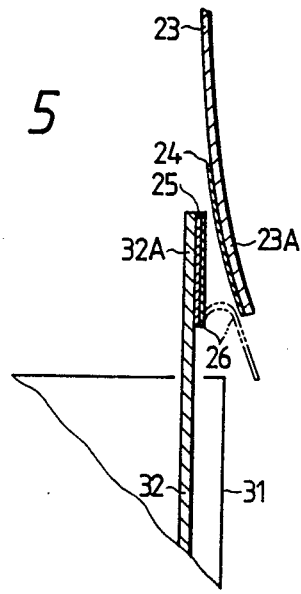
FIG. 5 is an enlarged cross-sectional view showing a loading means in its longitudinal direction according to the third embodiment shown in FIG. 4.

FIG. 5 is an enlarged cross-sectional view showing the recording sheet loading means in its longitudinal direction according to the third embodiment.

As shown in FIG. 5, a pressure-adhesive tape is secured to the tail end portion 23A of the lead member 23 and a double-faced adhesive tape is attached to the leading end portion of the roll sheet 32 of the supplying roll 33. Further, an exfoliating sheet 26 is beforehand attached to the double-faced adhesive tape 25 before use of the supplying roll 33. When the supplying roll 33 is used, the double-faced adhesive tape 25 at the leading end portion 32A is exposed by peeling off the exfoliating sheet 26, and is attached to the pressure-adhesive tape 24 so that the roll sheet 32 can be separably connected to the lead member 23 and can be drawn from the light-shield case 31 by a winding operation of the take-up roll 4.

The take-up motor M2 is intermittently driven in a copying operation, so that the roll sheet 32 is intermittently drawn from the light-shield case 31 to an exposure region located below an original 36, which is covered by an original cover 35. One surface (upper surface in FIG. 4) of the roll sheet 32 is coated with photo-curing ultra-fine microcapsules which accommodate chromogenic materials or dye precursors therein as described above. A pair of halogen lamps 37 and 38 are arranged forwardly and rearwardly, respectively beneath the original supporting surface. Further, an imaging lens 39 and a shutter 30 for setting an exposure time are arranged below the original supporting surface.

With the above construction, light from both halogen lamps 37 and 38 is directed to the original 36 and is reflected therefrom. The reflected light passes through the imaging lens 39 and the shutter 30 to the roll sheet 32. The microcapsules on the roll sheet are photo-cured by the reflected light 36, so that a latent image corresponding to the original 36 is recorded on the roll sheet 32.

A pair of pressure-developing rollers 41 and 42 are arranged respectively above and below the path of the roll sheet 32, and are positioned at the downstream side of the exposure portion in such a manner that both rollers are relatively movable toward and away from each other. The rollers are driven by a driving unit (not shown) to be rotated in synchronization with the intermittent movement of the roll sheet 32.

A cassette 44 for accommodating developer sheets 43 is arranged above the pressure-developing rollers 41 and 42. The developer sheets 43 in the cassette 44 pass through an arcuate path defined by respective pairs of supplying rollers 45, and are supplied to the surface of the roll sheet 32 which is coated with microcapsules, in synchronization with the intermittent movement of the roll sheet 32. The roll sheet, after being subjected to the exposure operation, and the developer sheet, overlaid, are fed to the gap between the pressure-developing rollers 41 and 42 and are pressed by both rollers. Under the pressure of the rollers, those microcapsules which have not been exposed to light are ruptured to release dye precursors therefrom, so that the dye precursors react with developer materials on the developer sheet 43 to thereby transfer the latent image on the roll sheet 32 to the developer sheet 43.

After being subjected to the pressure-developing operation, the roll sheet 32 is fed to the side of the take-up roll 34 while contacted with the developer sheet 43. The developer sheet 43 is fed to a gap between a pair of heat-fixing rollers 46 and 47 arranged above and below, respectively, and is subjected to a heat-fixing operation by the rollers 46 and 47, thereafter discharged to a sheet discharging tray 48.

Figure 6:
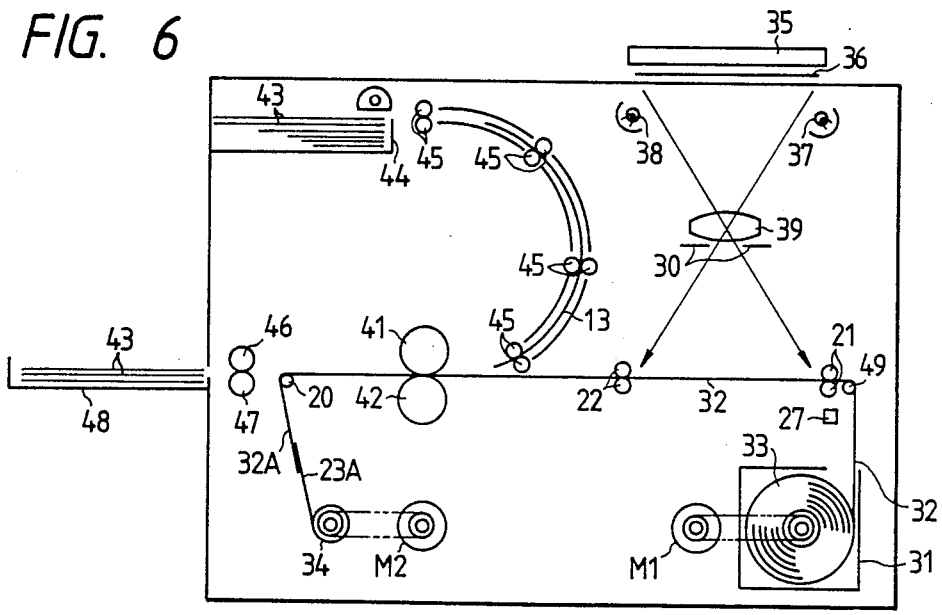
FIG. 6 is a cross-sectional view showing the image forming apparatus shown in FIG. 4 in a case where a connected portion between the recording sheet loading member and the recording sheet is shifted to the side of the take-up roll.
Figure 7:
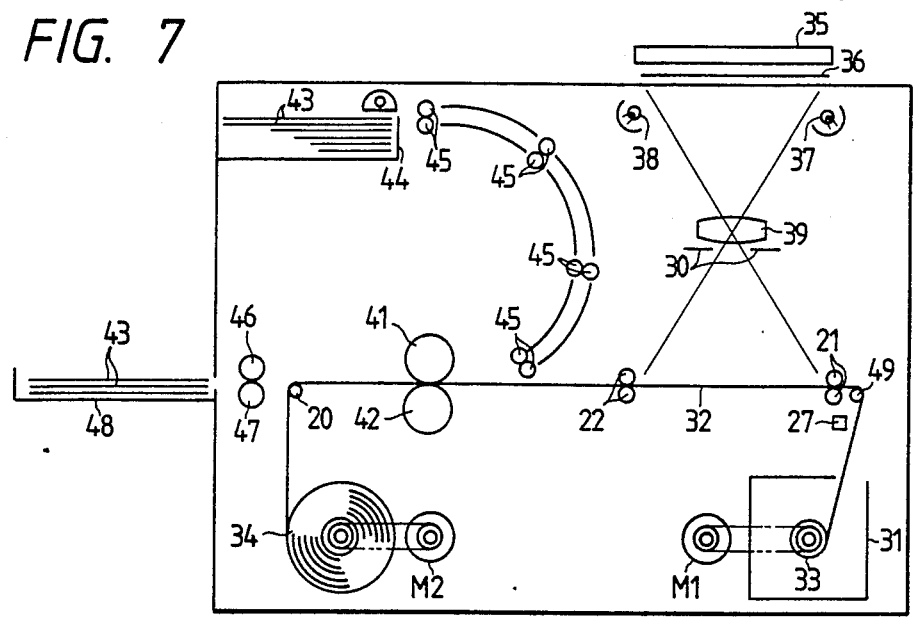
FIG. 7 is a cross-sectional view showing the image forming apparatus shown FIG. 4 in a case where the recording sheet is consumed.

As shown in FIG. 4, after the leading end portion 32A of the roll sheet at the side of the supplying roll 33 is connected with the tail end portion 23A of the lead member 23, the pressure-developing rollers 41 and 42 are moved away from each other and the leading end portion 32A of the roll sheet 32 is fed through the exposure portion to the side of the take-up roll 34 by driving the take-up motor M2 as shown in FIG. 6. Thus, the roll sheet 32 is drawn to the exposure region for permitting the exposure operation.

Immediately before the roll sheet 32 of the supplying roll 33 is consumed because of the repetitive operations of the exposure and pressure-development, an end mark provided on the tail end portion of the roll sheet 32 is detected by a photoelectric sensor 27 located below the guide roller 49 to thereby alarmingly indicate the necessity of exchange of the consumed roll sheet for a new one with a lamp or the like. In response to the indication of the lamp or the like, the consumed roll sheet of the take-up roll 34 is rewound to the supplying roll 33 by rotating the rewinding motor M1, to thereby shift the connected portion between the leading end portion 32A of the roll sheet 32 and the tail end portion 23A of the lead member 23 from the side of the take-up roll 34 to the side of the supplying roll 33. Then, the lead member 23 is separated from the consumed roll sheet 32 and the light-shield case 31 is exchanged for a new case accommodating a new supplying roll. Next, the tail end portion 23A of the lead member 23 is connected to a leading end portion of a new roll sheet in the newly loaded light-shield case 31, and the connected portion between the new roll sheet and the lead member is shifted to the side of the take-up roll 34 as shown in FIG. 6, whereby the exchange of the roll sheets is completed.

As described above, according to the above embodiment, it is not necessary to manually insert a roll sheet 32 into narrow gaps between the pair of guide rollers 21 and 22 and between the pair of the pressure-developing rollers 41 and 42, therefore roll sheet loading is not accompanied by the risk of manually handling the sheet carrying portion, the pressure-developing portion and the heat-fixing portion which are located proximately to the units supplied with high voltage and portions at high temperature in the image recording apparatus. Further, when the consumed roll sheet is exchanged for a new one, only the supplying roll is required to be exchanged and therefore the take-up roll 34 is not required to be exchanged for a new one, so that the take-up roll 34 is not discarded as used once and therefore the running cost can be considerably reduced.

Figure 8:
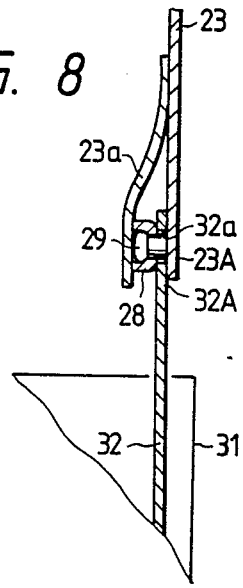
FIG. 8 is an enlarged cross-sectional view showing a loading means in its longitudinal direction according to a fourth embodiment of this invention.

The lead member is not limited to the embodiment as described above. For example, a lead member having a construction shown in FIG. 8 may be used in which an auxiliary member 23a is secured to the tail end portion 23 of the lead member 23, and a snap ring 28 and an engaging projection 29 are provided, so that the tail end portion of the lead member is elastically engaged with the leading portion of the roll sheet. In the embodiment as shown in FIG. 8, the leading end portion 32A of the roll sheet 32 is provided with a hole 32a into which the engaging projection 29 is hooked. If the tip of the engaging projection 29 has an acute angle, the engaging projection 29 can be stuck into the roll sheet 32, and therefore the hole 32a is not needed to be formed.

As examples of other connecting member for separably connecting the roll sheet 32 and the lead member 23, various methods such as a lace-faster method, a clip-locking method and a sewing method and so on may be used. Further, other types of a sensitive recording medium such as a photographic sheet with silver halide and a photosensitive/heat-sensitive recording sheet may be applied to this invention.

As described above, there is used a lead or guide means whose leading end is secured to the take-up roll so as to be windable around the take-up roll, and the lead member extends from the take-up roll through the roll sheet path to the supplying roll. Further, the tail end portion of the lead means is detachably connected to the leading end portion of the roll sheet. Accordingly, when the consumed roll sheet is exchanged for a new one, only the supplying roll is exchanged for a new one to automatically load the new roll sheet to the image forming apparatus, the running cost can be reduced and, there can be avoided a risk of inserting a hand into the sheet passage, the pressure-developing portion and the fixing portion which are located proximately to the units supplied with high voltage and the portions at high temperature in the image recording apparatus.

What is claimed is:

1. A loading apparatus for loading a photosensitive recording sheet to an image recording apparatus which comprises exposure and development portions, said loading apparatus, comprising:
    a supplying roll for supplying said image recording apparatus with said photosensitive recording sheet;
    a take-up roll for winding said photosensitive recording sheet from said supplying roll; and
    a recording sheet loading means, said recording sheet loading means comprising a sheet like guide member extending from said take-up roll through at least said exposure and development portions to said supplying roll, a leading end of said guide member being secured to said take-up roll so as to be windable therearound; and, an attaching member for detachably connecting a tail end of said guide member to a leading end portion of said photosensitive recording sheet in said supplying roll.

2. The loading apparatus as claimed in claim 1, wherein said attaching member comprises a pressure-adhesive tape secured to said tail end of said guide member and a double-faced adhesive tape attached to said leading end portion of said photosensitive recording sheet in said supplying roll.

3. The loading apparatus as claimed in claim 1, wherein said recording sheet loading means comprises a double-faced adhesive tape attached to said leading end portion of a new photosensitive recording sheet, said double-faced adhesive tape detachably connecting said leading end portion of said supplying roll to a tail end portion of said guide member secured to said take-up roll thereby directing said leading end portion of said photosensitive recording sheet to said take-up roll.

4. A loading apparatus as claimed in claim 1, wherein said attachment member comprises at least one engaging projection and one receiving part, one of said engaging projection or said receiving part attached to said tail end portion of said take-up roll and the other of said engaging projection or said receiving part attached to said leading end portion of said photosensitive recording sheet in said supplying roll.

5. A load apparatus as claimed in claim 1, wherein said sheet like guide member comprises a trailing end of a consumed photosensitive recording sheet being wound on said take-up roll.

6. A loading apparatus for loading a photosensitive recording sheet to an image recording apparatus which comprises exposure and development portions, said loading apparatus comprising:
    a supplying roll for supplying said image recording apparatus with said photosensitive recording sheet;
    a take-up roll for winding said photosensitive recording sheet from said supplying roll; and
    a recording sheet loading means, said recording sheet loading means comprising a double-faced adhesive tape attached to a leading end portion of said photosensitive recording sheet of said supplying roll, said double-faced adhesive tape detachably connecting said leading end portion of said supplying roll to a tail end portion of a guide member already wound over the take-up roll, said tail end portion being of a consumed photosensitive recording sheet of said take-up roll thereby directing said leading end portion of said photosensitive recording sheet of said supplying roll through at least said exposure and development portions to said take-up roll in correspondence with take-up operation of said consumed photosensitive recording sheet wherein said leading end portion of said supplying roll and said tail end portion of said take-up roll are provided with at least one projection and at least one hole respectively, said projection being engageable with said hole to thereby determine the connection position of said leading end portion of said photosensitive recording sheet of said supplying roll and said tail end portion of said consumed photosensitive recording sheet.

7. A method of loading a photosensitive recording sheet to an image recording apparatus which comprises exposure and development portions through which a sheet path extends, said method comprising the steps of:
    providing a first attachment means on a leading end portion of a new photosensitive recording sheet in a supplying roll;
    connecting a web-like member at one end to a take-up roll and providing a second attachment means at a second end;
    attaching said first attachment means of said new photosensitive recording sheet in a supplying roll to said second attachment means connected to said take-up roll by said web-like member; and
    rotating said take-up roll about its axis for taking-up said new photosensitive recording sheet over the exposure and development portions of said image recording apparatus and onto said take-up roll.

8. The method of claim 7, further comprising the steps of:
    forming one of said first and said second attachment means of at least one projection and at least one hole respectively;

engaging said projection with said hole to determine a connection position of said tail end of said web-like member and said leading end portion of said new photosensitive recording sheet in said supplying roll; and sealing said connection position by a piece of double sided adhesive tape mounted on said first attachment means, said web-like member comprising a consumed photosensitive recording sheet.

9. The method of claim 7, further comprising a first step of unwinding said web-like member from said take-up roll such that said one end remains attached to said take-up roll and said second end is adjacent to said leading end portion of said new photosensitive recording sheet in said supplying roll, said web-like member having a length substantially larger than said sheet path in said image recording apparatus.

10. A method of loading a photosensitive recording sheet to an image recording apparatus which comprises exposure, development and fixing portions, said method comprising the steps of:

forming an attaching portion in a leading end portion of a new photosensitive recording sheet in a supplying roll, said attaching portion having mounted thereon an attachment means;

connecting said attaching portion to a tail end portion of a consumed photosensitive recording sheet in a take-up roll, said tail end portion having space to removably receive said attachment means and;

winding said consumed photosensitive recording sheet to load said new photosensitive recording sheet to said image recording apparatus.

11. The method of claim 10, wherein said winding step further comprises the steps of;

detaching said leading end portion of said new photosensitive recording sheet from said tail end portion of said consumed photosensitive recording sheet when said leading end portion is brought into a position immediately upstream side of said take-up roll;

removing said consumed photosensitive recording sheet from a core portion of said take-up roll;

attaching said leading end portion of said new photosensitive recording sheet by said attachment means to said take-up core portion of said take-up roll; and, winding said new photosensitive recording sheet around said take-up roll.

* * * * *